(12) United States Patent
Nakatani et al.

(10) Patent No.: US 11,328,743 B2
(45) Date of Patent: May 10, 2022

(54) CURRENT-PERPENDICULAR-TO-PLANE GIANT MAGNETORESISTIVE ELEMENT, PRECURSOR THEREOF, AND MANUFACTURING METHOD THEREOF

(71) Applicant: NATIONAL INSTITUTE FOR MATERIALS SCIENCE, Tsukuba (JP)

(72) Inventors: Tomoya Nakatani, Tsukuba (JP); Taisuke Sasaki, Tsukuba (JP); Takao Furubayashi, Tsukuba (JP); Kazuhiro Hono, Tsukuba (JP)

(73) Assignee: NATIONAL INSTITUTE FOR MATERIALS SCIENCE, Tsukuba (JP)

( * ) Notice: Subject to any disclaimer, the term of this patent is extended or adjusted under 35 U.S.C. 154(b) by 0 days.

(21) Appl. No.: 17/040,645

(22) PCT Filed: Feb. 26, 2019

(86) PCT No.: PCT/JP2019/007261
§ 371 (c)(1),
(2) Date: Sep. 23, 2020

(87) PCT Pub. No.: WO2019/193871
PCT Pub. Date: Oct. 10, 2019

(65) Prior Publication Data
US 2021/0020193 A1 Jan. 21, 2021

(30) Foreign Application Priority Data

Apr. 4, 2018 (JP) .............................. JP2018-072048

(51) Int. Cl.
*G11B 5/39* (2006.01)
*G01R 33/09* (2006.01)
(Continued)

(52) U.S. Cl.
CPC .......... *G11B 5/3906* (2013.01); *G01R 33/093* (2013.01); *G11B 5/02* (2013.01);
(Continued)

(58) Field of Classification Search
None
See application file for complete search history.

(56) References Cited

U.S. PATENT DOCUMENTS 7,782,575 B2    8/2010   Tsuchiya et al.
7,920,362 B2 *  4/2011   Hara ................... G11B 5/59683
                                                    360/324.1
(Continued)

FOREIGN PATENT DOCUMENTS

JP    2006-073875 A    3/2006
JP    2008-283194 A    11/2008
(Continued)

OTHER PUBLICATIONS

Takagishi et al., "Magnetoresistance Ratio and Resistance Area Design of CPP-MR Film for 2-5 Tb/in2 Read Sensors", IEEE Transactions on Magnetics, vol. 46, No. 6, pp. 2086-2089, Jun. 2010.
(Continued)

*Primary Examiner* — Jefferson A Evans
(74) *Attorney, Agent, or Firm* — Morgan, Lewis & Bockius LLP (57) ABSTRACT

Provided is a precursor of a current-perpendicular-to-plane giant magnetoresistive element having a laminated structure of ferromagnetic metal layer/nonmagnetic metal layer/ferromagnetic metal layer, the precursor having a nonmagnetic intermediate layer containing a non-magnetic metal and an oxide in a predetermined ratio such that the distribution thereof is nearly uniform at the atomic level. Also provided is a current-perpendicular-to-plane giant magnetoresistive
(Continued)

element having a current-confinement structure (CCP) which has: a current confinement structure region made of a conductive alloy and obtained by heat-treating a laminated structure of a ferromagnetic metal layer and a nonmagnetic intermediate layer at a predetermined temperature; and a high-resistance metal alloy region containing an oxide and surrounding the current confinement structure region.

14 Claims, 6 Drawing Sheets

(51) Int. Cl.
- G11B 5/02 (2006.01)
- G11B 5/127 (2006.01)
- G11B 5/706 (2006.01)
- G11C 11/16 (2006.01)
- H01L 43/02 (2006.01)
- H01L 43/08 (2006.01)
- H01L 43/10 (2006.01)
- G11B 5/31 (2006.01)
- H01L 43/12 (2006.01)

(52) U.S. Cl.
CPC .......... *G11B 5/1278* (2013.01); *G11B 5/3163* (2013.01); *G11B 5/3903* (2013.01); *G11B 5/70621* (2013.01); *G11C 11/161* (2013.01); *H01L 43/02* (2013.01); *H01L 43/08* (2013.01); *H01L 43/10* (2013.01); *H01L 43/12* (2013.01); *G11B 2005/3996* (2013.01)

(56) References Cited

U.S. PATENT DOCUMENTS

| | | | |
|---|---|---|---|
| 7,978,442 B2* | 7/2011 | Zhang | H01F 10/3259 360/324.2 |
| 8,031,441 B2 | 10/2011 | Zhang et al. | |
| 8,094,421 B2* | 1/2012 | Lin | G11B 5/3909 360/324.2 |
| 8,213,129 B2 | 7/2012 | Fukuzawa et al. | |
| 8,379,350 B2 | 2/2013 | Matsuzawa et al. | |
| 8,498,083 B2 | 7/2013 | Koike et al. | |
| 8,551,626 B2* | 10/2013 | He | B82Y 10/00 428/811.1 |
| 9,047,891 B1 | 6/2015 | Childress et al. | |
| 9,437,223 B2 | 9/2016 | Shirotori et al. | |
| 9,837,105 B2 | 12/2017 | Hashimoto et al. | |
| 10,755,733 B1* | 8/2020 | Zheng | G11B 5/1278 |
| 2006/0114616 A1* | 6/2006 | Sbiaa | G11B 5/3903 360/324.1 |
| 2007/0188936 A1* | 8/2007 | Zhang | H01L 43/08 360/324.1 |
| 2008/0102315 A1* | 5/2008 | Fukuzawa | H01F 10/3259 428/811.2 |
| 2008/0150640 A1* | 6/2008 | Dimitrov | H03B 15/006 331/3 |
| 2008/0278864 A1* | 11/2008 | Zhang | B82Y 25/00 360/324.12 |
| 2011/0007421 A1* | 1/2011 | Hara | B82Y 25/00 360/234.3 |
| 2015/0225297 A1* | 8/2015 | Sato | C23C 14/3414 204/298.13 |
| 2016/0099014 A1* | 4/2016 | Shirotori | G11B 5/3906 360/313 |
| 2019/0094315 A1* | 3/2019 | Inubushi | G11B 5/3909 |
| 2019/0237099 A1 | 8/2019 | Kasai et al. | |
| 2020/0212295 A1* | 7/2020 | Suzuki | H01L 43/02 |
| 2021/0012940 A1* | 1/2021 | Salahuddin | H01L 43/06 |

FOREIGN PATENT DOCUMENTS

| | | |
|---|---|---|
| JP | 4942445 B2 | 5/2012 |
| JP | 5018982 B2 | 9/2012 |
| JP | 5316633 B2 | 10/2013 |
| JP | 2016-071922 A | 5/2016 |
| JP | 6097344 B2 | 3/2017 |
| JP | 2017-097935 A | 6/2017 |
| WO | 2017/222038 A1 | 12/2017 |

OTHER PUBLICATIONS

Shimazawa et al., "CPP-GMR Film with ZnO-Based Novel Spacer for Future High-Density Magnetic Recording", IEEE Transactions on Magnetics, vol. 46, No. 6, pp. 1487-1490, Jun. 2010.

Fukuzawa et al. "MR Ratio Enhancement by NOL Current-Confined-Path Structures in CPP Spin Valves", IEEE Transactions on Magnetics, vol. 40, No. 4, pp. 2236-2238, Jul. 2004.

Yuasa et al., "Enhancement of magnetoresistance by hydrogen ion treatment for current-perpendicular-to-plane giant magnetoresistive films with a current-confined-path nano-oxide layer", Applied Physics Letters 97, 112501 (2010).

Sato et al., "Localized spin-Torque Effect in CPP-GMR Sensor With Current-Screen Layer", IEEE Transactions on Magnetics, vol. 46, No. 6, pp. 1610-1613, Jun. 2010.

International Search Report (with partial translation) and Written Opinion dated May 14, 2019, issued in corresponding International Patent Application No. PCT/JP2019/007261.

* cited by examiner

| | COMPARATIVE EXAMPLE | EXAMPLE |
|---|---|---|
| PROTECTION LAYER | Ru (8) | |
| UPPER FERROMAGNETIC LAYER | $Co_{37}Fe_{37}B_{19}Ta_7$ (1.5) | |
| | $Co_{50}Mn_{15}Fe_{10}Ge_{25}$ (5) | |
| | $Co_{50}Fe_{50}$ (0.4) | |
| NON-MAGNETIC SPACER LAYER | InZnO (1.3–1.75) | AgInZnO (1.2) |
| | Ag (0.4) | |
| LOWER FERROMAGNETIC LAYER | $Co_{50}Fe_{50}$ (0.4) | |
| | $Co_{50}Mn_{15}Fe_{10}Ge_{25}$ (5) | |
| | $Co_{37}Fe_{37}B_{19}Ta_7$ (1.5) | |
| | $Co_{50}Fe_{50}$ (0.5) | |
| UNDERLAYER | Ru (2) | |
| | Ta (2) | |
| ELECTRODE | Cu (100) | |
| SUBSTRATE | THERMALLY OXIDIZED Si | |

ALLOY COMPOSITIONS ARE IN ATOMIC PERCENT
VALUES IN PARENTHESES ARE FILM THICKNESS (NANOMETER)

| ROLE | COMPARATIVE EXAMPL | EXAMPLE |
|---|---|---|
| PROTECTION LAYER | Ru (8) | |
| FERROMAGNETIC FREE LAYER | Co50Fe50 (1) | |
| | Co50Mn15Fe10Ge25 (4) | |
| | Co50Fe50 (0.4) | |
| NON-MAGNETIC SPACER LAYER | AgSn (3.5) | AgInZnO (1.2) |
| FERROMAGNETIC REFERENCE LAYER | Co50Fe50 (0.4) | |
| | Co50Mn15Fe10Ge25 (3) | |
| | CoFeBTa (0.8) | |
| | Co50Fe50 (0.6) | |
| COUPLING LAYER | Ru (0.8) | |
| FERROMAGNETIC FIXED LAYER | Co50Fe50 (2.6) | |
| ANTIFERROMAGNETIC LAYER | IrMn (5) | |
| UNDERLAYER | Ru (2) | |
| | Ta (2) | |
| LOWER ELECTRODE | Cu (100) | |
| SUBSTRATE | THERMALLY OXIDIZED Si | |

FIG. 10

| | NON-MAGNETIC SPACER LAYER | RA ($\Omega\mu m^2$) | MR RATIO (%) |
|---|---|---|---|
| COMPARATIVE EXAMPLE | AgSn (3.5 nm) | 0.04 | 14 |
| EXAMPLE | AlZO (Ag 20%) (1.2 nm) | 0.07 | 14 |
| | AlZO (Ag 20%) (1.4 nm) | 0.11 | 35 |
| | AlZO (Ag 25%) (1.2 nm) | 0.07 | 24 |
| | AlZO (Ag 25%) (1.4 nm) | 0.07 | 27 |
| | AlZO (Ag 29%) (1.2 nm) | 0.05 | 19 |
| | AlZO (Ag 29%) (1.4 nm) | 0.06 | 24 |
| | AlZO (Ag 33%) (1.2 nm) | 0.05 | 11 |
| | AlZO (Ag 33%) (1.4 nm) | 0.05 | 21 |

CURRENT-PERPENDICULAR-TO-PLANE GIANT MAGNETORESISTIVE ELEMENT, PRECURSOR THEREOF, AND MANUFACTURING METHOD THEREOF

TECHNICAL FIELD

The present invention relates to a current perpendicular to plane-giant magnetoresistance (CPP-GMR; Current-Perpendicular-to-Plane Giant MagnetoResistance) element based on a ferromagnetic/non-magnetic/ferromagnetic three-layer thin film structure, a precursor thereof, and a manufacturing method thereof.

BACKGROUND ART

Current-perpendicular-to-plane giant magnetoresistance (CPP-GMR) elements represent an important technique for the read heads of hard disk drives and magnetic sensors. For the non-magnetic spacer layer, a noble metal such as Cu or Ag, an alloy thereof, a laminate structure of a noble metal and an oxide such as Cu/ZnO/Zn or Ag/InZnO/Zn, or a current-confined-path (CCP; Current-Confined-Path) which is AlOx with Cu distributed therein has heretofore been used.

The non-magnetic spacer layer in a current-perpendicular-to-plane giant magnetoresistance (CPP-GMR) element serves an important role in determining the element's magnetoresistance ratio (output). While CPP-GMR elements have been expected to be applied to the read heads of hard disk drives and magnetic sensors, they are required to achieve a high magnetoresistance ratio by using a thin non-magnetic spacer layer in view of the spatial resolution and the signal-to-noise ratio for reading of recording bits. It is also important to achieve 0.1 $\Omega\mu m^2$ as the optimal value of the resistance-area product (RA) value of the elements (Non-patent Literature 1). While Cu or Ag has heretofore been used for the non-magnetic spacer layer, Non-patent Literatures 2 and 3 and Patent Literatures 1 to 5 disclose that the magnetoresistance ratio can be increased by using a laminate structure of a metal(s) and an oxide such as Cu/ZnO/Zn, Cu/GaO/Zn, Cu/AlMgO, or Ag/InZnO/Zn or a current-confined-path (CCP) which is AlOx with Cu distributed therein.

However, these conventional devices have the following problems.

(1) The MR ratio is about 20 to 30% at the highest.
(2) The value of the resistance-area product RA of the element cannot be lowered to 0.2 $\Omega\mu m^2$ or less.
(3) The film thickness of the non-magnetic spacer layer 2 nm or more, which is relatively large.

CITATION LIST

Patent Literatures

Patent Literature 1: Japanese Patent No. 4942445
Patent Literature 2: Japanese Patent No. 5316633
Patent Literature 3: Japanese Patent No. 5018982
Patent Literature 4: Japanese Patent No. 6097344
Patent Literature 5: U.S. Pat. No. 9,047,891B1

Non-Patent Literatures

Non-patent Literature 1: IEEE Transaction on Magnetics, Vol. 46, p. 2086 (2010)
Non-patent Literature 2: IEEE Transaction on Magnetics, Vol. 46, p. 1487 (2010)
Non-patent Literature 3: IEEE Transaction on Magnetics, Vol. 40, p. 2236 (2004)
Non-patent Literature 4: Yuasa et al. Applied Physics Letters 97, 112501 (2010) Non-patent Literature 5: Sato et al. IEEE Transaction on Magnetics Vol. 46, p. 1610 (2010)

SUMMARY OF INVENTION

Technical Problems

Due to such circumstances, a non-magnetic spacer layer material to solve these problems is needed. The present invention has solved the above problems, and an object thereof to provide a current-perpendicular-to-plane giant magnetoresistance element capable of reducing the thickness of the non-magnetic spacer layer and increasing the magnetoresistance ratio, and to provide a precursor thereof and a manufacturing method thereof.

Solution to Problems (1) A precursor of a current-perpendicular-to-plane giant magnetoresistance element according to the present invention is a precursor of a current-perpendicular-to-plane giant magnetoresistance element having a laminate structure of a ferromagnetic metal layer/a non-magnetic metal layer/a ferromagnetic metal layer, including the non-magnetic spacer layer containing a non-magnetic metal and an oxide at a predetermined ratio and containing the non-magnetic metal and the oxide in a roughly uniform manner at an atomic level.

(2) A current-perpendicular-to-plane giant magnetoresistance element according to the present invention is such that a current-confined-path (CCP) is formed which is the precursor of a current-perpendicular-to-plane giant magnetoresistance element according to (1), is formed by performing a heat treatment at a predetermined temperature on the laminate structure of the ferromagnetic metal layers and the non-magnetic spacer layer, and has a current-confined-path region consisting of a conductive alloy and a high-resistance metal alloy region containing an oxide formed so as to surround the current-confined-path region.

In the chemical reaction in the heat treatment, for example, Mn contained in the ferromagnetic metal layers is oxidized into MnO, and InO contained in the precursor of the non-magnetic spacer layer is reduced and dissolves into Ag to become a AgIn alloy and form a current-confined-path region consisting of a conductive alloy.

(3) The current-perpendicular-to-plane giant magnetoresistance element according to the present invention includes: a substrate being a silicon substrate, an AlTiC ceramic substrate, or a monocrystalline MgO substrate; an underlayer laminated on the substrate; and a current-perpendicular-to-plane giant magnetoresistance effect layer according to (2) having a lower ferromagnetic layer and an upper ferromagnetic layer consisting of a cobalt (Co)-based Heusler alloy and laminated on the substrate, and a non-magnetic spacer layer provided between the lower ferromagnetic layer and the upper ferromagnetic layer and including a current-confined-path.

(4) A method of manufacturing a current-perpendicular-to-plane giant magnetoresistance element according to the present invention includes: forming an underlayer on a silicon substrate or a ceramic substrate; forming a giant magnetoresistance effect layer on the silicon substrate or the ceramic substrate on which the underlayer is formed, the giant magnetoresistance effect layer having a lower ferromagnetic material layer, a non-magnetic spacer layer, and an upper ferromagnetic material layer in this order, the non-magnetic spacer layer being a metal and an oxide sputtered simultaneously to form a precursor of the current-perpendicular-to-plane giant magnetoresistance element; and performing a heat treatment on the precursor of the current-perpendicular-to-plane giant magnetoresistance element at 250° C. or higher and 400° C. or lower.

(5) A method of manufacturing a current-perpendicular-to-plane giant magnetoresistance element according to the present invention includes: cleaning a surface of a monocrystalline MgO substrate; cleaning the monocrystalline MgO substrate by heating at a substrate temperature of 300° C. or higher; forming an underlayer on the monocrystalline MgO substrate cleaned by the heating, the underlayer being formed at the substrate temperature; forming a giant magnetoresistance effect layer on the monocrystalline MgO substrate on which a film of a first non-magnetic material is formed, the giant magnetoresistance effect layer having a lower ferromagnetic material layer, a non-magnetic spacer layer, and an upper ferromagnetic material layer in this order, the non-magnetic spacer layer being a metal and an oxide sputtered simultaneously to form a precursor of the current-perpendicular-to-plane giant magnetoresistance element; and performing a heat treatment on the precursor of the current-perpendicular-to-plane giant magnetoresistance element at 250° C. or higher and 400° C. or lower.

Advantageous Effects of Invention

According to the current-perpendicular-to-plane giant magnetoresistance element of the present invention, when Ag/InZnO representing a conventional technique and AgInZnO representing the present invention are compared, the highest value of the magnetoresistance ratio is about 35% with Ag/InZnO, whereas a magnetoresistance ratio above 60% can be obtained with AgInZnO. Also, the techniques of Non-patent Literature 2 and Patent Literatures 1 to 3 cannot reduce the RA value to 0.2 $\Omega\mu m^2$ or less, but with AgInZnO the RA value can be reduced to 0.05 $\Omega\mu m^2$ by adjusting the Ag concentration. Further, the film thickness of Ag/InZnO is Ag (0.4 nm)/InZnO (1.3 to 1.75 nm), which makes a total 1.7 to 2.15 nm, whereas AgInZnO measures 1.2 nm, thereby enabling a reduction in the film thickness of the non-magnetic spacer layer. With a CPP-GMR element using a laminate structure of AgInZnO/InZnO as the non-magnetic spacer layer, a magnetoresistance ratio above 60% can be achieved within a range where RA=0.1 to 0.15 $\Omega\mu m^2$.

For conventional non-magnetic spacer layers with a laminate structure of a metal and an oxide, a plurality of sputtering targets are required. However, for the non-magnetic spacer layer according to the present invention, the number of sputtering targets required in a sputtering apparatus can be reduced by using a sputtering target in which a metal and an oxide are mixed in advance. Accordingly, improvements of production efficiency and a cost reduction can be expected.

DESCRIPTION OF EMBODIMENTS

Hereinbelow, the present invention will be described using the drawings.

Figure 1:
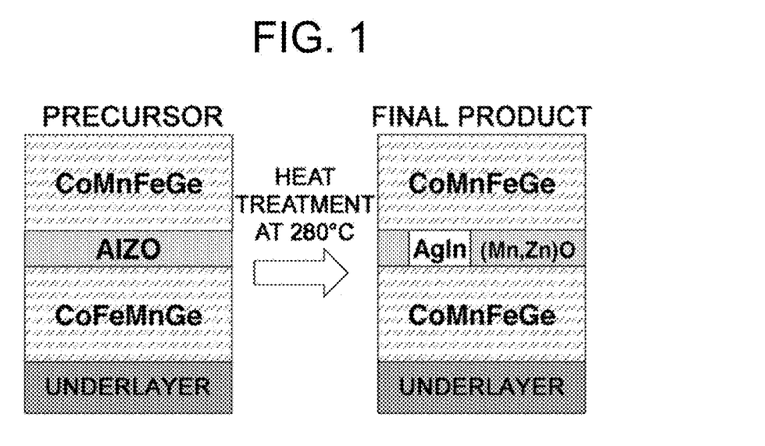
FIG. 1 is a diagram representing an embodiment of the present invention and illustrating the structure of a current-confined-path generated by a heat treatment on a precursor.

FIG. 1 is a diagram representing an embodiment of the present invention and illustrating the structure of a current-confined-path generated by a heat treatment on a precursor. In the present invention, the current-confined-path is obtained by causing a redox reaction as below between the precursor, e.g., AgInZnO, and an element making up ferromagnetic layers or an additional element X.

$$AgInZnO+X \rightarrow AgIn+XO \quad (1)$$

The precursor (e.g., AgInZnO) is a base oxide with a non-magnetic metallic element added thereto. $In_2O_3$, ZnO, $SnO_2$, $Ga_2O_3$, and a mixture thereof are possible options for the oxide. Cu, Ag, and Au are possible options for the non-magnetic metallic element. The element making up the ferromagnetic layers or the additional element X needs to be such that the enthalpy of growth of the oxide thereof is negatively greater than the element (In, Zn, Sn, Ga) making up the oxide of the precursor. In this way, X reduces the oxide of the precursor. Table 1 is a list of oxides and non-magnetic metallic elements for the precursor, and ferromagnetic bodies.

TABLE 1

The composition of each layer in the final product is as follows.

| | |
|---|---|
| (i) Composition of AgIn: | $Ag_{65}In_{35}$ at. % |
| (ii) Composition of (Mn,Zn)O: | $Mn_{50}Zn_4O_{46}$ at. % |
| (iii) Composition of CoMnFeGe: | $Co_{49}Mn_{14}Fe_{14}Ge_{23}$ at. % |
| (iv) Density of AgIn current-confined-path: | 5 to 20% |

While a current-confined-path is formed by performing a heat treatment on a precursor, the CPP-GMR element structure according to the present invention will be described by using a precursor laminated with a clear laminate structure for explanatory convenience. The structure of the currentconfined-path is affected by conditions of the heat treatment on the precursor, e.g., the temperature of the heat treatment and the time of the heat treatment.

Figure 2:
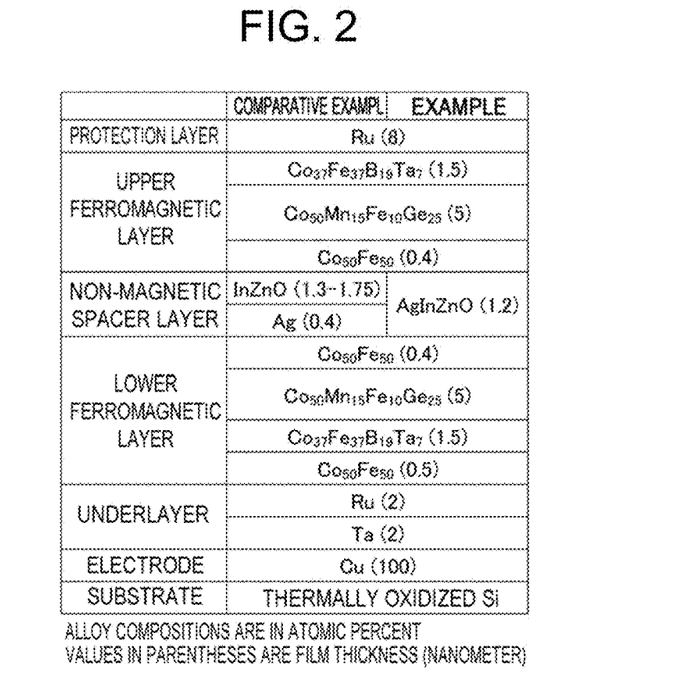
FIG. 2 is a diagram illustrating the structure of a CPP-GMR element used in an embodiment of the present invention along with Comparative Example.

With a CPP-GMR element structure illustrated in FIG. 2, two types of non-magnetic spacer layers Ag (0.4 nm)/InZnO (1.3 to 1.75 nm) representing a conventional technique (Comparative Example) and AgInZnO (1.2 nm) representing the present invention were compared. The CPP-GMR element was one using polycrystalline thin films that were important in industrial applications, and a heat treatment was performed for three hours at 280° C. after the film deposition.

In the diagram, a thermally oxidized silicon substrate is used as the substrate, but the substrate may be a MgO substrate, a monocrystalline silicon substrate, or a polycrystalline silicon substrate, or made of a ceramic such as AlTiC. When a substrate is a silicon substrate, a general-purpose Si substrate of a large diameter such as 8 inches can be used.

A 100-nm copper layer is used as the electrode layer, but the electrode layer may only need to be of a conductive metallic material and may be of, for example, silver, gold, or permalloy (NiFe alloy). Also, the film thickness of the electrode layer may only need to be a film thickness usable in the CPP-GMR element structure, and is desirably 30 nm or more and 1 μm or less, for example. Less than 30 nm increases the electrical resistance of the thin film and is therefore not preferable for the electrode layer. A film thickness more than 1 μm lowers the effect of reducing the electrical resistance of the thin film and increases the amount of the electrode material to be used in the electrode layer, and is therefore not preferable. Nonetheless, the upper limit value of the film thickness of the electrode layer is determined by the balance between the electrical resistance and the film formation process, and may be 10 μm or 100 μm if there is no intention for optimization.

The underlayer desirably consists of at least one substance selected from the group consisting of Cu, Ag, Cr, W, Mo, Au, Pt, Pd, Rh, Ta, Ru, and NiFe. The underlayer is used to adjust the compatibility between the substrate and electrode layer and the ferromagnetic/non-magnetic/ferromagnetic three-layer thin film structure of the current-perpendicular-to-plane giant magnetoresistance (CPP-GMR) element as a film structure. In this Example, Ta (2 nm) and Ru (2 nm) are used. The metallic material and film thickness of the underlayer are determined by the compatibility between the substrate and electrode layer and the ferromagnetic/non-magnetic/ferromagnetic three-layer thin film structure and the product yield. Thus, the film thickness of the underlayer is desirably 0.5 nm or more and less than 100 nm. If the film thickness of the underlayer is 100 nm or more, the surface roughness is poor, and if the film thickness is less than 0.5 nm, a continuous film cannot be formed and thus the effect of an underlayer cannot be obtained, so that the magnetoresistance ratio necessary for the present usage cannot be obtained.

The ferromagnetic layers desirably consists of at least one substance selected from among the four types of Co-base Heusler alloys listed in table 1 (CoFeX, CoMnZX, CoMnFeZX, and CoFeZX; for details of the elements X and Z, see the corresponding sections in table 1). The film thickness of the ferromagnetic layers is desirably 1 nm or more and less than 10 nm. If the ferromagnetic layers measure 10 nm or more, the influence of spin relaxation in the ferromagnetic layers is large, and if measuring less than 1 nm, the effect of spin asymmetry scattering in the ferromagnetic layers is low, so that the magnetoresistance ratio necessary for the present usage cannot be obtained.

The non-magnetic spacer layer at the precursor stage contains a non-magnetic metal and an oxide at a predetermined ratio (e.g., a ratio corresponding to Example illustrated in FIG. 2) and contains the non-magnetic metal and the oxide in a roughly uniform manner at the atomic level. For the non-magnetic spacer layer to have the non-magnetic metal and the oxide distributed in a roughly uniform manner at the atomic level, it is desirable to, for example, simultaneously sputter the metal and the oxide to make the precursor of the current-perpendicular-to-plane giant magnetoresistance element. Also, besides sputtering, a vacuum film formation method such as vapor deposition or a wet film formation method may be used to make the precursor. It is desirable that the non-magnetic metal be at least one substance selected from among Cu, Ag, Au, and an alloy thereof and the oxide be at least one substance selected from among $In_2O_3$, ZnO, $SnO_2$, $Ga_2O_3$, and a mixture thereof, as mentioned above. The non-magnetic spacer layer will be a current-confined-path by performing a heat treatment on the precursor, as mentioned above.

The protection layer desirably consists of at least one substance selected from the group consisting of Ag, Cr, W, Mo, Au, Pt, Pd, Ta, Ru and Rh. The film thickness of the protection layer is desirably 1 nm or more and less than 20 nm.

In Example illustrated in FIG. 2, the lower ferromagnetic layer is a four-layer structure using a laminated structure of a Heusler alloy of $Co_{50}Mn_{15}Fe_{10}Ge_{25}$ (atomic %) (5 nm) and $Co_{37}Fe_{37}B_{19}Ta_7$ (1.5 nm) with $Co_{50}Fe_{50}$ (0.4 nm and 0.5 nm) laminated on the non-magnetic spacer layer side and the underlayer side.

The nominal composition of the InZnO in the Ag/InZnO non-magnetic spacer layer is $In_{35}Zn_6O_{59}$ (atomic %). The nominal composition of the AgInZnO is $Ag_x(In_{35}Zn_6O_{59})_{100-x}$ (x=20 to 35 atomic %), and the concentration of the Ag was adjusted by adjusting the power applied to the Ag target in the simultaneous sputtering film formation.

The upper ferromagnetic layer uses a laminated structure of a Heusler alloy of $Co_{50}Mn_{15}Fe_{10}Ge_{25}$ (atomic %) (5 nm) and $Co_{37}Fe_{37}B_{19}Ta_7$ (1.5 nm), but the order of lamination is opposite from that in the lower ferromagnetic layer due the presence of the protection layer. The upper ferromagnetic layer is a three-layer structure further having $Co_{50}Fe_{50}$ (0.4 nm) laminated on the non-magnetic spacer layer side. Ru with a film thickness of 8 nm is used as the protection layer.

Next, a process of manufacturing a device configured as above will be described.

Figure 3:
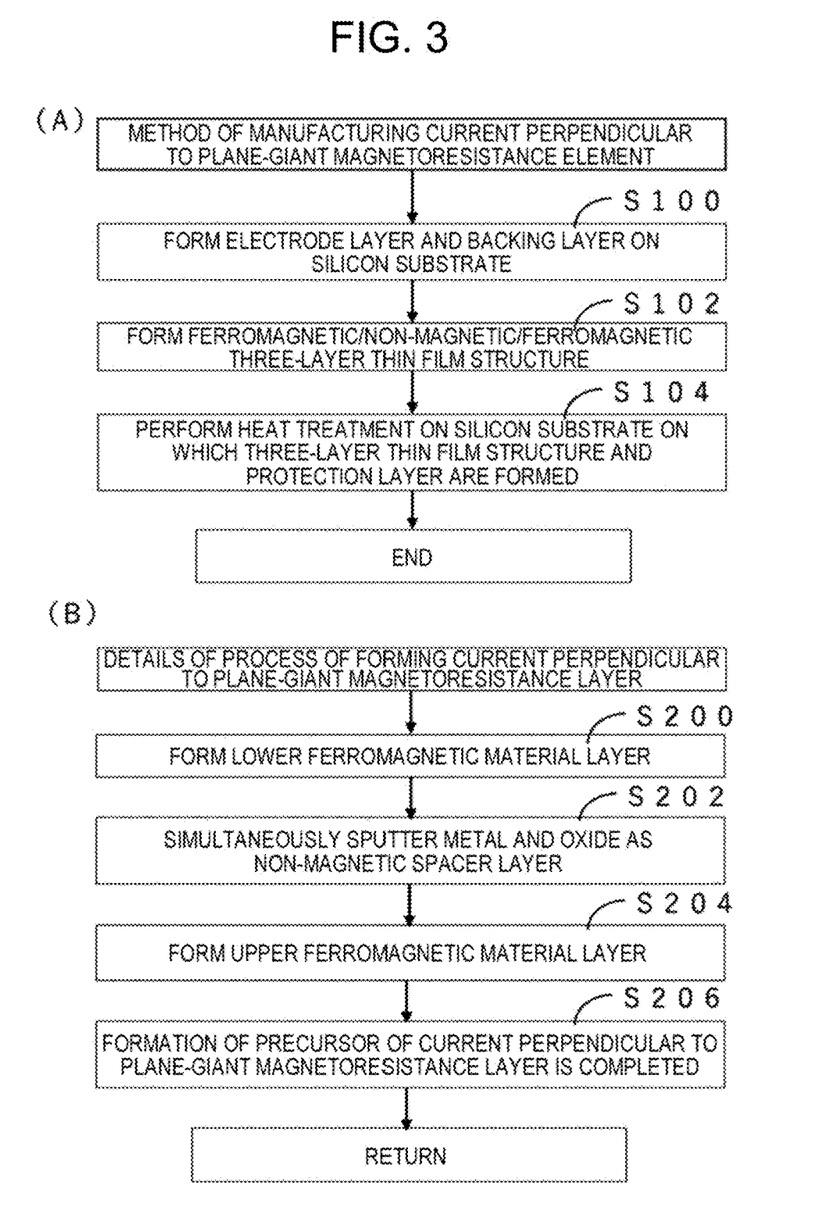
FIG. 3 is a set of flowcharts describing a method of manufacturing a current-perpendicular-to-plane giant magnetoresistance element with a silicon substrate representing an embodiment of the present invention.

FIG. 3 is a set of flowcharts describing a method of manufacturing a current-perpendicular-to-plane giant magnetoresistance element with a silicon substrate representing an embodiment of the present invention, with (A) being a schematic process chart of the entirety and (B) being a detailed chart of a process of forming a current-perpendicular-to-plane giant magnetoresistance effect layer. In FIG. 3, films of non-magnetic materials that serve as an electrode layer and an underlayer are formed on the silicon substrate (S100). Then, a ferromagnetic/non-magnetic/ferromagnetic three-layer thin film structure is formed on the silicon substrate on which the electrode layer and the underlayer are formed (S102). Note that the laminate of the ferromagnetic/non-magnetic/ferromagnetic three-layer thin film structure may be a single body, or a plurality of them may be provided. Then, a protection layer is formed on the silicon substrate on which the ferromagnetic/non-magnetic/ferromagnetic three-layer thin film structure is formed. Lastly, the silicon substrate on which the ferromagnetic/non-magnetic/ferromagnetic three-layer thin film structure and the protection layer are formed is subjected to a heat treatment as post annealing at 250° C. or higher and 400° C. or lower (S104).

A heat treatment temperature lower than 250° C. makes the degree of chemical order of the Heusler alloy layers insufficient and also requires an excessively long time for the non-magnetic spacer layer to become a current-confined-path, and is therefore not practical. A heat treatment temperature higher than 400° C. causes mutual diffusion of the CPP-GMR laminate films, which deteriorates magnetoresistance properties, and is therefore not preferable. The post annealing may be performed inside the film formation apparatus before the protection layer is formed. By performing the heat treatment on the precursor, the non-magnetic spacer layer becomes a current-confined-path, so that a current-perpendicular-to-plane giant magnetoresistance layer is obtained.

Details of the process of forming the ferromagnetic/non-magnetic/ferromagnetic three-layer thin film structure will now be described with reference to FIG. 3(B). In the process of forming the ferromagnetic/non-magnetic/ferromagnetic three-layer thin film structure, the lower ferromagnetic material layer is formed first (S200). Then, a metal and an oxide are simultaneously sputtered as the non-magnetic spacer layer to make the precursor of the current-perpendicular-to-plane giant magnetoresistance element (S202). Lastly, the upper ferromagnetic material layer is formed (S204). As a result, the formation of the precursor of the current-perpendicular-to-plane giant magnetoresistance layer as a laminate is completed (S206). Note that the process of FIG. 3(B) may be repeated as appropriate in the case of providing a plurality of current-perpendicular-to-plane giant magnetoresistance layers.

Figure 4:
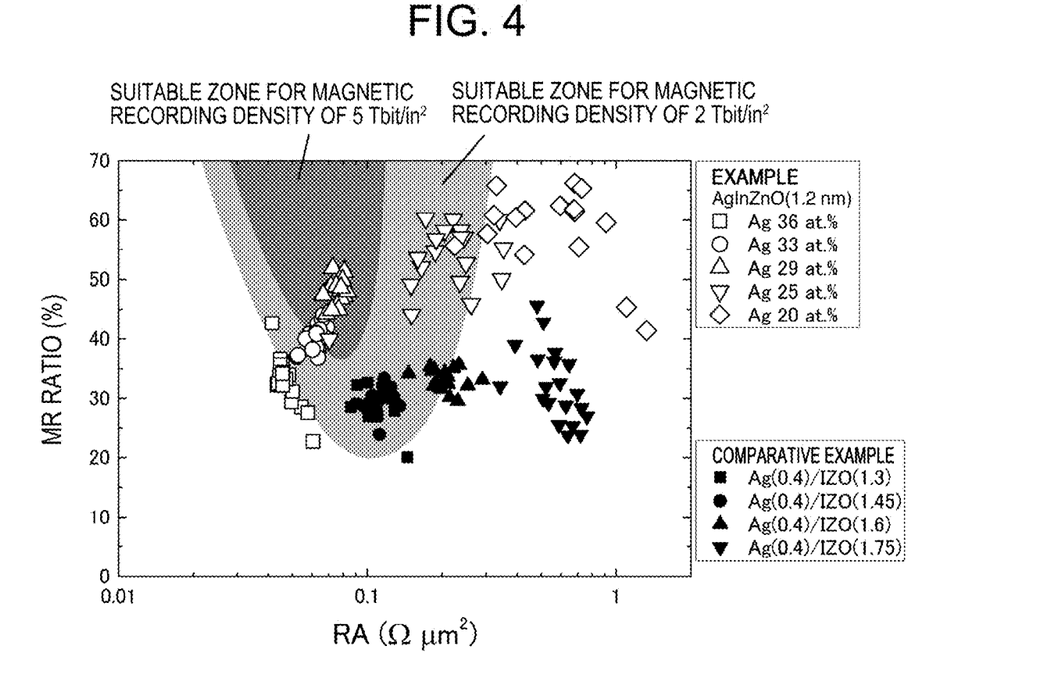
FIG. 4 is a data diagram of the RAs and the magnetoresistance ratios (MR ratios) of CPP-GMR elements representing some embodiments of the present invention.

Next, physical properties of the current-perpendicular-to-plane giant magnetoresistance element of the present invention thus manufactured will be described. FIG. 4 is a diagram illustrating values of the magnetoresistance ratio (MR ratio) and the RA at room temperature. In the case of using Ag/InZnO, which represents the conventional technique, as the non-magnetic spacer layer, the RA can be adjusted from about 0.1 $\Omega\mu m^2$ to about 0.7 $\Omega\mu m^2$ by adjusting the film thickness of the InZnO. The highest magnetoresistance ratio was about 35%. For reference, the shaded regions indicate RA and magnetoresistance ratio ranges required for the read heads of hard disk drives with surface recording densities of 2 Tbit/in$^2$ (terabits/square inch) and 5 Tbit/in$^2$ disclosed in Non-patent Literature 1. RA=0.1 $\Omega\mu m^2$ and a magnetoresistance ratio of 20% or higher are required for 2 Tbit/in$^2$, and RA=0.08 $\Omega\mu m^2$ and a magnetoresistance ratio of 36% or higher are required for 5 Tbit/in$^2$. In other words, the higher the surface recording density is, the lower the RA is required and the higher the magnetoresistance ratio is required. This is because the higher the surface recording density, the smaller the read head element and the larger the noise, and therefore achieving a sufficiently high signal-to-noise ratio requires reducing the RA of the element to reduce the thermal noise and also increasing the magnetoresistance ratio to increase the signal intensity.

The CPP-GMR element using Ag/InZnO as the non-magnetic spacer layer satisfies the required performance for 2 Tbit/in$^2$ but cannot satisfy the required performance for 5 Tbit/in$^2$. The RA of the CPP-GMR using AgInZnO as the non-magnetic spacer layer can be adjusted from about 0.05 $\Omega\mu m^2$ to about 0.7 $\Omega\mu m^2$ by adjusting the Ag concentration in the AgInZnO. The higher the Ag concentration, the lower RA. The highest magnetoresistance ratio MR is above 60%, and thus a high magnetoresistance ratio MR as compared to the Ag/InZnO (highest magnetoresistance ratio=35%) can be obtained. What is notable is that a magnetoresistance ratio MR of approximately 50% can be obtained at RA=0.08 $\Omega\mu m^2$ by using AgInZnO with a Ag concentration of approximately 29 atomic %. This satisfies the required performance for 5 Tbit/in$^2$, as illustrated in FIG. 4. Also, the film thickness of the AgInZnO is 1.2 nm, which is smaller than 1.7 to 2.15 nm of the Ag/InZnO. Accordingly, the film thickness of the read head can be reduced. This contributes to improvement in spatial resolution for bit reproduction. Note that it can be determined based on the actual measurement values in FIG. 4 that the Ag concentration satisfying the required performance for 5 Tbit/in$^2$ is 27 to 32 atomic %, and the Ag concentration satisfying the required performance for 2 Tbit/in$^2$ is 23 to 36 atomic %.

Figure 5:
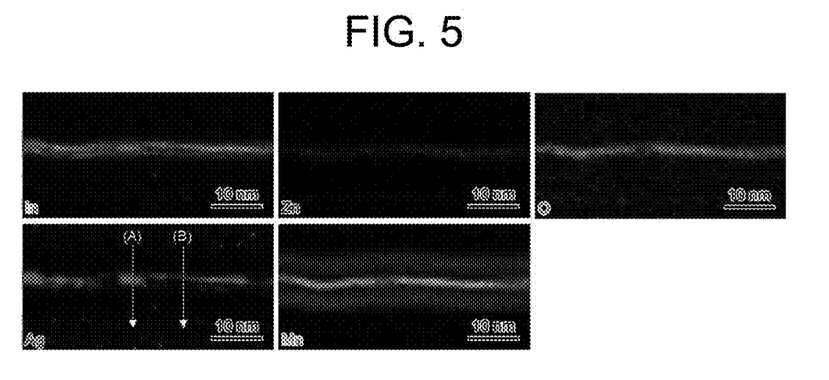
FIG. 5 is a set of images illustrating mapping of elements (In, Zn, O, Ag, and Mn) in a CPP-GMR element with a AgInZnO non-magnetic spacer layer representing an embodiment of the present invention.

FIG. 5 illustrates analysis data on the distribution of elements obtained by energy-dispersive X-ray spectroscopy (EDS) on the CPP-GMR element having the AgInZnO non-magnetic spacer layer with a scanning transmission electron microscope. The CPP-GMR element structure illustrated in FIG. 2 was fabricated by sputtering, and the thin film's microscopic structure was altered by the diffusion of atoms resulting from the heat treatment. Characteristic features are as follows.

(1) Mn atoms diffused from the $Co_{50}Mn_{15}Fe_{10}Ge_{25}$ Heusler alloy layers into the AgInZnO and were oxidized, thereby forming a MnO layer. Accordingly, the In in the AgInZnO at least in some part was reduced and moved to the outside of the MnO layer.

(2) The Ag was unevenly distributed in the in-plane direction of the film and form an AgIn alloy with the reduced In and in some part formed a bridge (region (A) in FIG. 5) connecting the upper and lower ferromagnetic layers across the MnO layer.

Figure 6:
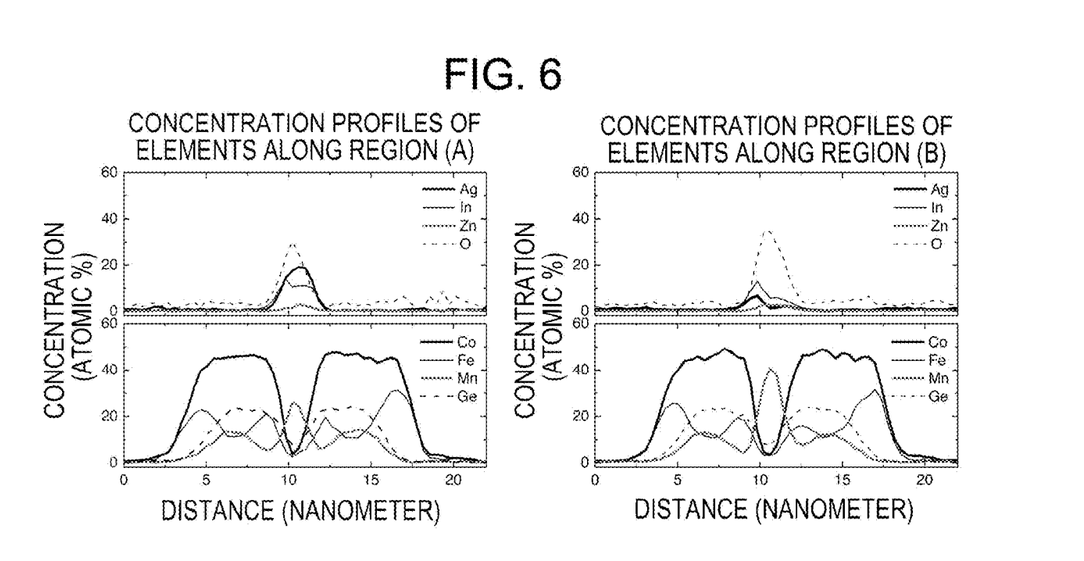
FIG. 6 is a set of diagrams illustrating the concentration distributions of elements in regions (A) and (B) in FIG. 5.

FIG. 6 is a set of diagrams illustrating the concentration profiles of the elements by the EDS scanned along (A) and (B) in FIG. 5. In the scanned region (A), it is suggested that both Ag and In are present and form a AgIn alloy at the position of the non-magnetic spacer layer (Distance=around 10 nm). Mn and O are also observed, but this can be considered due to the MnO layer overlapping in the depth direction of the sample thin piece used in the electron microscope observation. However, the possibility that a trace amount of oxygen may be present in the AgIn cannot be ruled out.

In the scan region (B), Ag and In are present on and under the MnO layer at the position of the non-magnetic spacer layer, that is, a three-layer structure of AgIn/MnO/AgIn is formed. The MnO is a semiconductor with a rock salt structure having a band gap of about 4 eV, and is assumed to have higher resistivity than metals. The resistivity of the AgIn, on the other hand, is assumed to be lower than that of the MnO. In such a case, current is assumed to flow preferentially through the AgIn bridge portion (region (A)). In other words, current concentrates at the AgIn bridge. Such a structure is called a current-confined-path (CCP; Current-Confined-Path), and it is well known that a non-magnetic spacer layer having a CCP increases the magnetoresistance ratio.

As a non-magnetic spacer layer having a CCP, an alumina $AlO_x$ with Cu diffused therein (hereinafter AlOx-Cu CCP) has been well known, and it is generally fabricated by forming a thin film of an AlCu alloy by sputtering and oxidizing the thin film in a vacuum chamber. There have been reports that a magnetoresistance ratio above 20% is achieved by using an $AlO_x$—Cu CCP (e.g., Non-patent Literatures 4 and 5). A problem with an $AlO_x$—Cu CCP is that the magnetoresistance ratio abruptly drops in a range where RA=0.2 $\Omega\mu m^2$ or lower. For example, a CPP-GMR element using an $AlO_x$—Cu CCP illustrated in FIG. 1 of Non-patent Literature 5 has a magnetoresistance ratio of as low as 10% at RA=0.1 $\Omega\mu m^2$ and thus does not satisfy performance as a read head. In contrast, the combination of the $Co_{50}Mn_{15}Fe_{10}Ge_{25}$ Heusler alloy and the AgInZnO non-magnetic spacer layer according to the present invention achieves a magnetoresistance ratio of 30 to 50% in the range where RA=0.05 to 0.08 $\Omega\mu m^2$, thus exhibiting superior properties to the conventional $AlO_x$—Cu CCP.

Figure 7:
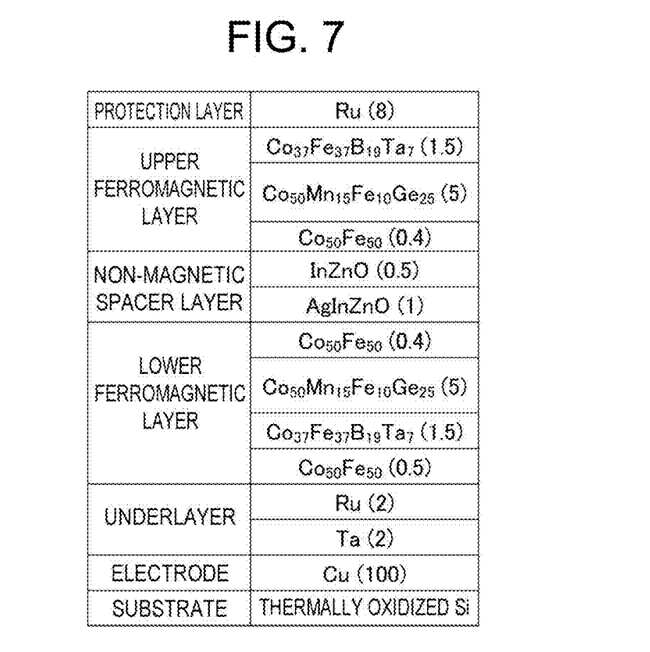
FIG. 7 is a diagram illustrating a CPP-GMR element structure with AgInZnO/InZnO as the non-magnetic spacer layer representing an embodiment of the present invention.
Figure 8:
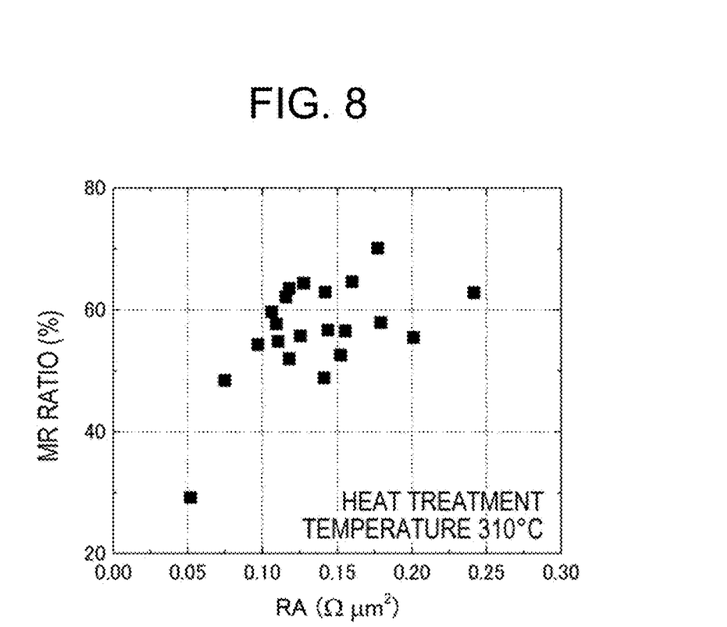
FIG. 8 is a diagram illustrating the RA and the magnetoresistance ratio of a CPP-GMR element fabricated after a one-hour heat treatment at 310° C.

The magnetoresistance ratio is further increased by using a laminate structure of AgInZnO and InZnO as the non-magnetic spacer layer as illustrated in FIG. 7. A AgInZnO (1 nm)/InZnO (0.5) non-magnetic spacer layer is an example. The nominal composition of the Ag in the AgInZnO is 29 atomic %. FIG. 8 is a diagram illustrating the RA and the magnetoresistance ratio of a CPP-GMR element fabricated after a one-hour heat treatment at 310° C. A magnetoresistance ratio above 60% is achieved in the range where RA=0.1 to 0.15 $\Omega\mu m^2$, which is an improvement in magnetoresistance ratio as compared to a CPP-GMR element using a non-magnetic spacer layer with a single AgInZnO layer.

A case where has been presented in which the structure of the current-perpendicular-to-plane giant magnetoresistance element in the above Example is electrode/underlayer/ferromagnetic layer/non-magnetic layer/ferromagnetic layer/protection layer. Actual magnetic heads, however, employ a spin valve structure of electrode/underlayer/antiferromagnetic layer/ferromagnetic layer (fixed layer)/Ru coupling layer/ferromagnetic layer (reference layer)/non-magnetic layer/ferromagnetic layer (free layer)/protection layer. Thus, the current-perpendicular-to-plane giant magnetoresistance element according to the present invention may have the spin valve structure. Here, a spin valve-type GMR element has a structure in which its non-magnetic layer is sandwiched between a fixed layer including an antiferromagnetic layer and a ferromagnetic layer and a free layer including only a ferromagnetic layer. The ferromagnetic layer in the fixed layer has its direction of magnetization fixed due to exchange coupling with the antiferromagnetic layer, and exhibits a GMR effect by changing the direction of magnetization of the free layer. By utilizing this GMR effect, the spin valve-type GMR element is employed as a magnetic read head of a hard disk drive. The spin valve is called a spin valve since it is capable controlling the amount of flowing current as if a valve opening and closing to control the direction of magnetization of the free layer.

Figure 9:
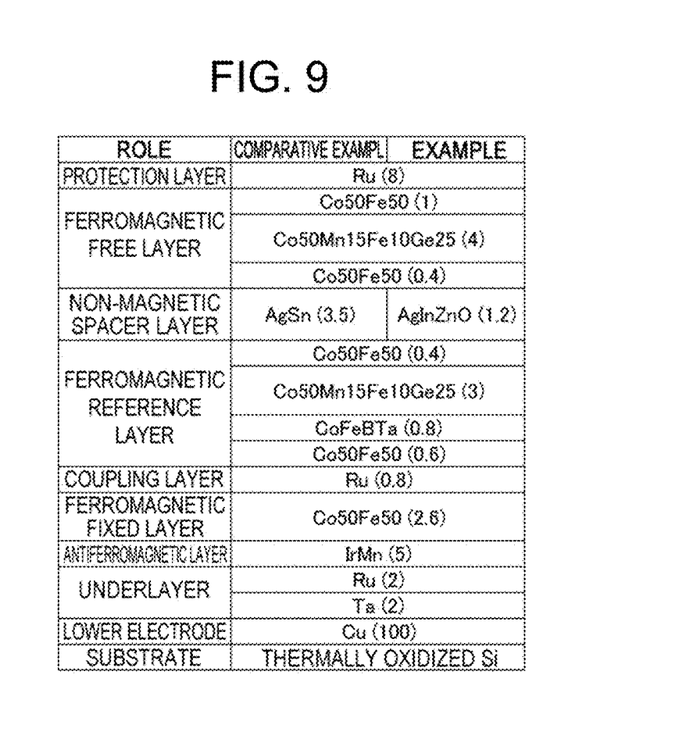
FIG. 9 is a diagram illustrating a spin valve film structure representing an embodiment of the present invention along with Comparative Example.

FIG. 9 is a diagram illustrating a spin valve film structure representing an embodiment of the present invention, and also illustrating Comparative Example. Note that the films in FIG. 9 with the same compositions as those in FIG. 2 will be given the same names and briefly described, and detailed description thereof may be omitted. In FIG. 9, a thermally oxidized silicon substrate is used as the substrate. A 100-nm copper layer is used as the lower electrode layer, but the lower electrode layer may only need to be of a conductive metallic material and may be of, for example, silver, gold, or permalloy (NiFe alloy). Ta (2 nm) and Ru (2 nm) are used as the underlayer.

IrMn (5 nm) is used as the antiferromagnetic layer. The antiferromagnetic layer is required to have a large exchange coupling magnetic field (Hua) with the fixed layer and a high blocking (Ta) temperature at which the Hua disappears. As a Mn alloy-based material, a disordered material such as IrMn, FeMn, or RuRhMn, or an ordered material such as PtMn, PtPdMn, NiMn, or $IrMn_3$ is used. As an oxide-based material, NiO or $\alpha$-$Fe_2O_3$ is used.

$Co_{50}Fe_{50}$ (2.6 nm) is used as the ferromagnetic layer (fixed layer), but the ferromagnetic layer (fixed layer) may be made of a combination of Co, Fe, and Ni at an appropriate composition ratio. Ru (0.8 nm) is used as the coupling layer, but Cr, Ir, or Rh may be used instead.

For the ferromagnetic layer (reference layer), a similar film structure to the lower ferromagnetic layer illustrated in FIG. 2 is used. The ferromagnetic layer (reference layer) is a four-layer structure using a laminated structure of a Heusler alloy of $Co_{50}Mn_{15}Fe_{10}Ge_{25}$ (atomic %) (3 nm) and $Co_{37}Fe_{37}B_{19}Ta_7$ (0.8 nm) with $Co_{50}Fe_{50}$ (0.4 nm and 0.6 nm) laminated on the non-magnetic spacer layer side and the coupling layer side.

For the non-magnetic spacer layer, a similar film structure to the non-magnetic spacer layer illustrated in FIG. 2 is used. In the spin valve film structure illustrated in FIG. 9, two types of non-magnetic spacer layers AgSn (3.5 nm) representing a conventional technique (Comparative Example) and AgInZnO (1.2 nm) representing the present invention are illustrated.

For the ferromagnetic layer (free layer), a similar film structure to the upper ferromagnetic layer illustrated in FIG. 2 is used. The ferromagnetic layer (free layer) is a three-layer structure including a Heusler alloy of $Co_{50}Mn_{15}Fe_{10}Ge_{25}$ (atomic %) (4 nm) with $Co_{50}Fe_{50}$ (0.4 nm and 1.0 nm) laminated on the non-magnetic spacer layer side and the protection layer side. Note that, like the ferromagnetic layer (fixed layer), the ferromagnetic layer (reference layer) and the ferromagnetic layer (free layer) may be made of a combination of Co, Fe, and Ni at an appropriate composition ratio.

Ru with a film thickness of 8 nm is used as the protection layer. The protection layer desirably consists of at least one substance selected from the group consisting of Ag, Cr, W, Mo, Au, Pt, Pd, Ta, Ru, and Rh.

The spin valve film structure uses polycrystalline thin films that are important in industrial applications, and a current-confined-path corresponding to the precursor laminate is generated by performing a heat treatment, for example, at 250° C. to 400° C. for one to five hours after the film formation.

Figure 10:
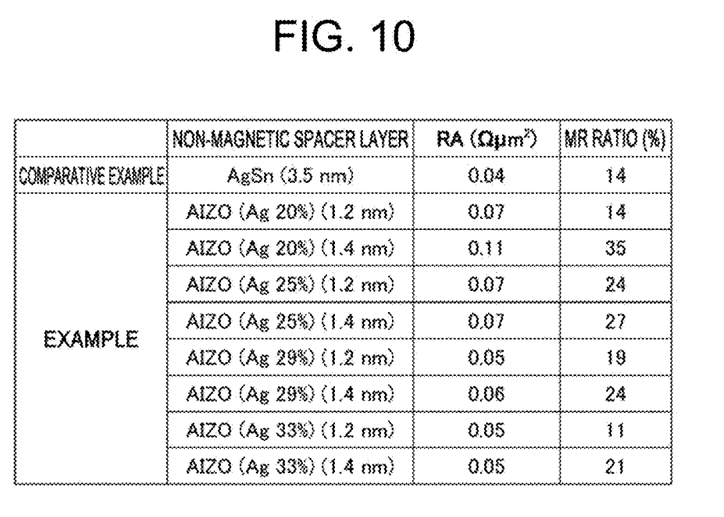
FIG. 10 is a diagram illustrating test data on spin valves representing some embodiments of the present invention.

FIG. 10 is a diagram illustrating test data on spin valves representing some embodiments of the present invention. In Comparative Example, AgSn (3.5 nm) is used as the non-magnetic spacer layer, and the MR ratio is 14% at a sheet resistance (RA) value of 0.04 $\Omega\mu m^2$. In contrast, with AgInZnO (Ag: 20 atomic %, 1.2 nm) representing an Example of the present invention, the value of the MR ratio obtained was 14% at a sheet resistance (RA) value of 0.07 $\Omega\mu m^2$, which was than that in Comparative Example. AgInZnO (Ag: 20 atomic %, 1.4 nm) had the best magnetic properties such that the MR ratio was 35% at a sheet resistance (RA) value of 0.11 $\Omega\mu m^2$. In the cases of AgInZnO with a film thickness (1.4 nm), the value of the MR ratio obtained was 21 to 35%, which was better than that in Comparative Example, when the Ag composition ratio was in the range of 20 to 33 atomic % and the sheet resistance (RA) value was 0.05 to 0.11 $\Omega\mu m^2$. In the cases of AgInZnO with a film thickness (1.2 nm), the value of the MR ratio obtained was 11 to 24%, which was comparable to that in Comparative Example, when the Ag composition ratio was in the range of 20 to 33 atomic % and the sheet resistance (RA) value was 0.05 to 0.07 $\Omega\mu m^2$.

It is needless to say that the present invention shall not be interpreted as limited to the above embodiments but design changes can be made as appropriate within an extent obvious to those skilled in the art.

INDUSTRIAL APPLICABILITY

The current-perpendicular-to-plane giant magnetoresistance element and the spin valve film structure according to the present invention are preferably usable in the read heads of hard disk drives, magnetic sensors, and magnetic memories.

The invention claimed is:

1. A precursor of a current-perpendicular-to-plane giant magnetoresistance element having a precursor laminate structure of a ferromagnetic metal layer/a non-magnetic metal layer/a ferromagnetic metal layer, comprising:
a non-magnetic spacer layer containing a non-magnetic metal and an oxide at a predetermined ratio and containing the non-magnetic metal and the oxide in a roughly uniform manner at an atomic level,
wherein the oxide is at least one substance selected from among $In_2O_3$, $SnO_2$, $Ga_2O_3$, and a mixture thereof.

2. The precursor of a current-perpendicular-to-plane giant magnetoresistance element according to claim 1, wherein
the non-magnetic metal is Ag,
the oxide is InZnO (a mixture of $In_2O_3$ and ZnO), and
the precursor of a current-perpendicular-to-plane giant magnetoresistance element comprises the non-magnetic spacer layer consisting of a AgInZnO single-layer structure or a AgInZnO/InZnO laminate structure.

3. A current-perpendicular-to-plane giant magnetoresistance element, wherein a current-confined-path (CCP) is formed from the precursor of a current-perpendicular-to-plane giant magnetoresistance element according to claim 2, is formed by performing a heat treatment at a predetermined temperature on the precursor laminate structure in which the ferromagnetic metal layers are CoMnFeGe and the non-magnetic spacer layer is AgInZnO, through a redox reaction between an element constituting the ferromagnetic metal layers and an oxide constituting the precursor, and has a current-confined-path region consisting of AgIn and a high-resistance region containing (Mn, Zn)O formed so as to surround the current-confined-path region.

4. The current-perpendicular-to-plane giant magnetoresistance element according to claim 3, wherein composition ranges of the AgIn, the (Mn, Zn)O, and the CoMnFeGe are the following ranges:
$Ag_{100-x}In_x$ (x=1 to 80 at. %);
$(Mn_{1-x}Zn_x)_{100-y}O_y$ (x=0 to 0.5, y=20 to 80 at. %); and
$Co_{35-60}Mn_{0-30}Fe_{0-30}Ge_{20-40}$ at. % (but the Mn and the Fe shall not be 0 at. % simultaneously).

5. The current-perpendicular-to-plane giant magnetoresistance element according to claim 3, wherein areas of the current-confined-path region and the high-resistance region in the current-confined-path are such that a ratio of the area of the current-confined-path region is 1% or more and 50% or less.

6. The current-perpendicular-to-plane giant magnetoresistance element according to claim 3, wherein the current-perpendicular-to-plane giant magnetoresistance element has
a magnetoresistance (MR) ratio of 50% or more, and
a resistance-area product (RA) of 0.03 $\Omega\mu m^2$ or more and 0.2 $\Omega\mu m^2$ or less.

7. The current-perpendicular-to-plane giant magnetoresistance element according to claim 3, comprising:
a substrate being a silicon substrate, an AlTiC ceramic substrate, or a MgO substrate; and
an underlayer laminated on the substrate,
wherein a first of the ferromagnetic metal layers of the precursor laminate structure forms a lower ferromagnetic layer, a second of the ferromagnetic metal layers of the precursor laminate structure forms an upper ferromagnetic layer, and
wherein the lower ferromagnetic layer and the upper ferromagnetic layer consist of a Co-base Heusler alloy and are laminated on the substrate, and
wherein the non-magnetic spacer layer includes the current-confined-path and is provided between the lower ferromagnetic layer and the upper ferromagnetic layer.

8. The current-perpendicular-to-plane giant magnetoresistance element according to claim 7, wherein the underlayer consists of at least one substance selected from the group consisting of Cu, Ag, Cr, W, Mo, Au, Pt, Pd, Rh, Ta, Ru, and NiFe.

9. The current-perpendicular-to-plane giant magnetoresistance element according to claim 3, comprising:
a substrate being a silicon substrate, an AlTiC ceramic substrate, or a monocrystalline MgO substrate;
an underlayer laminated on the substrate; and
a spin valve structure laminated on the substrate,
wherein the spin valve structure consists of:
an antiferromagnetic layer,
a ferromagnetic layer (pinned layer),
a Ru coupling layer,
a ferromagnetic layer (reference layer) formed from a first of the ferromagnetic metal layers of the precursor laminate structure,
a non-magnetic layer formed from the non-magnetic metal layer of the precursor laminate structure,
a ferromagnetic layer (free layer) formed from a second of the ferromagnetic metal layers of the precursor laminate structure, and
a protection layer,
wherein the ferromagnetic layer (reference layer) is a lower ferromagnetic layer and the ferromagnetic layer (free layer) is an upper ferromagnetic layer,
wherein the lower ferromagnetic layer and the upper ferromagnetic layer consist of a Co-base Heusler alloy and are laminated on the substrate, and
wherein the non-magnetic spacer layer includes the current-confined-path and is provided between the lower ferromagnetic layer and the upper ferromagnetic layer as the non-magnetic layer of the spin valve structure.

10. A read head to be used on a storage element, the read head using the current-perpendicular-to-plane giant magnetoresistance element according to claim 3.

11. A magnetic sensor using the current-perpendicular-to-plane giant magnetoresistance element according to claim 3.

12. A magnetic memory using the current-perpendicular-to-plane giant magnetoresistance element according to claim 3.

13. The precursor of a current-perpendicular-to-plane giant magnetoresistance element according to claim 1, wherein
with an additional element denoted as X, at least one of the ferromagnetic metal layers of the precursor laminate structure consists of
a CoFeX (where X is an element selected from among Mg, Ti, V, Cr, and Mn) alloy, or
a Heusler alloy selected from the group consisting of CoMnZX (where Z is an element selected from among Al, Si, Ga, and Ge, and X is an element selected from among Mg, Ti, V, and Cr), CoMnFeZX (where Z is an element selected from among Al, Si, Ga, and Ge, and X is an element selected from among Mg, Ti, V, and Cr), and CoFeZX (where Z is an element selected from among Al, Si, Ga, and Ge, and X is an element selected from among Mg, Ti, V, and Cr).

14. A method of manufacturing a current-perpendicular-to-plane giant magnetoresistance element, comprising steps of:

cleaning a surface of a monocrystalline MgO substrate;

cleaning the monocrystalline MgO substrate by heating at a substrate temperature of 300° C. or higher;

forming an underlayer on the monocrystalline MgO substrate cleaned by the heating, the underlayer being formed at the substrate temperature;

forming a giant magnetoresistance effect layer on the monocrystalline MgO substrate on which a non-magnetic conductive film is formed, the giant magnetoresistance effect layer having a lower ferromagnetic material layer, a non-magnetic spacer layer, and an upper ferromagnetic material layer in this order, the non-magnetic spacer layer being a metal and an oxide sputtered simultaneously to form a precursor of the current-perpendicular-to-plane giant magnetoresistance element; and performing a heat treatment on the precursor of the current-perpendicular-to-plane giant magnetoresistance element at 250° C. or higher and 400° C. or lower.

* * * * *